(12) United States Patent
Liu

(10) Patent No.: US 9,911,476 B2
(45) Date of Patent: Mar. 6, 2018

(54) SYSTEMS AND METHODS FOR VOICE DATA PROCESSING

(71) Applicant: Tencent Technology (Shenzhen) Company Limited, Shenzhen (CN)

(72) Inventor: Qiuge Liu, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 469 days.

(21) Appl. No.: 14/265,918

(22) Filed: Apr. 30, 2014

(65) Prior Publication Data

US 2014/0343930 A1 Nov. 20, 2014

Related U.S. Application Data

(63) Continuation of application No. PCT/CN2013/084827, filed on Oct. 8, 2013.

(30) Foreign Application Priority Data

May 14, 2013 (CN) .......................... 2013 1 0177301

(51) Int. Cl.
*G11C 7/16* (2006.01)
*G06F 13/16* (2006.01)

(52) U.S. Cl.
CPC ............ *G11C 7/16* (2013.01); *G06F 13/1673* (2013.01)

(58) Field of Classification Search
CPC ...................................................... G11C 7/16
See application file for complete search history.

(56) References Cited

U.S. PATENT DOCUMENTS

| 5,790,538 A | 8/1998 | Sugar | |
| 6,389,478 B1 * | 5/2002 | Blackmore | H04L 29/06 709/236 |
| 7,948,976 B2 * | 5/2011 | Arad | H04L 47/10 370/389 |
| 2002/0051465 A1 * | 5/2002 | Fang | H04L 69/18 370/470 |

(Continued)

FOREIGN PATENT DOCUMENTS

| CN | 1342358 A | 3/2002 |
| CN | 1399462 A | 2/2003 |

(Continued)

OTHER PUBLICATIONS

China Patent Office, Office Action dated Nov. 4, 2015, in Application No. 201310177301.7.

(Continued)

*Primary Examiner* — Hassan Kizou
*Assistant Examiner* — Abdullahi Ahmed
(74) *Attorney, Agent, or Firm* — Jones Day

(57) ABSTRACT

Systems and methods are provided for voice data processing. For example, a first data packet included in voice data transmitted by a client is received; the first data packet is stored in a storage area; whether to process one or more second data packets stored in the storage area is determined based on at least information associated with a type of the first data packet and a current storage state of the storage area; in response to a determination to process the second data packets, voice resources are applied for; and the second data packets stored in the storage area are processed using the voice resources.

9 Claims, 5 Drawing Sheets

| Receive a first data packet included in voice data transmitted by a client, and store the first data packet in a storage area; | 101 |

| Determine whether to process one or more second data packets stored in the storage area based on at least information associated with a type of the first data packet and a current storage state of the storage area; | 102 |

| In response to a determination to process the second data packets, apply for voice resources; and process the second data packets stored in the storage area using the voice resources | 103 |

(56) References Cited

U.S. PATENT DOCUMENTS

| | | | |
|---|---|---|---|
| 2002/0141392 A1 | 10/2002 | Tezuka et al. | |
| 2005/0025105 A1* | 2/2005 | Rue | H04L 12/5693 370/338 |
| 2006/0224724 A1* | 10/2006 | Marinescu | H04L 63/0209 709/224 |
| 2006/0233163 A1 | 10/2006 | Celi, Jr. et al. | |
| 2008/0183884 A1 | 7/2008 | Chen et al. | |
| 2010/0169661 A1* | 7/2010 | Summers | G06F 21/72 713/189 |
| 2013/0182624 A1* | 7/2013 | Sun | H04W 52/0212 370/311 |
| 2014/0343930 A1* | 11/2014 | Liu | G11C 7/16 704/201 |
| 2015/0215214 A1* | 7/2015 | Ng | H04L 47/193 370/230 |

FOREIGN PATENT DOCUMENTS

| | | |
|---|---|---|
| CN | 1501675 A | 6/2004 |
| CN | 1852110 A | 10/2006 |
| CN | 101247331 A | 8/2008 |
| CN | 101247432 A | 8/2008 |
| EP | 0637160 A2 | 2/1995 |

OTHER PUBLICATIONS

Patent Cooperation Treaty, International Search Report and Written Opinion of the International Searching Authority, PCT/CN2013/084827, dated Feb. 20, 2014.

Patent Cooperation Treaty, International Preliminary Report on Patentability, PCT/CN2013/084827, dated Nov. 17, 2015.

China Patent Office, Office Action dated Feb. 22, 2016, in Application No. 201310177301.7.

\* cited by examiner

SYSTEMS AND METHODS FOR VOICE DATA PROCESSING

CROSS-REFERENCES TO RELATED APPLICATIONS

This application is a continuation of International Application No. PCT/CN2013/084827, with an international filing date of Oct. 8, 2013, now pending, which claims priority to Chinese Patent Application No. 201310177301.7, filed May 14, 2013, both applications being incorporated by reference herein for all purposes.

FIELD OF THE INVENTION

Certain embodiments of the present invention are directed to computer technology. More particularly, some embodiments of the invention provide systems and methods for data processing. Merely by way of example, some embodiments of the invention have been applied to image processing. But it would be recognized that the invention has a much broader range of applicability.

BACKGROUND OF THE INVENTION

With the rapid development of mobile communication technology, voice services are gradually replacing text services. Users can directly input voices at a client. The client receives the voice input from a user, converts the received voices into certain voice data and processes the converted voice data.

Conventionally, the client often divides the voice data, packs the pieces of the voice data into a plurality of data packets and transmits these data packets to the server consecutively according to a sequence in the voice data. A first data packet that is transmitted by the client corresponds to an initial packet, and a last transmitted data packet corresponds to a final packet. The data packets other than the initial packet and the final packet correspond to middle packets. When the initial packet from the client is received, the server applies for voice resources and processes the initial packet using the voice resources. After the initial packet is processed, the server waits for a next data packet transmitted by the client. Upon receipt of a middle packet from the client, the server processes the received middle packet using the voice resources. When the final packet from the client is received, the server processes the received final packet using the voice resources and, after the final packet is processed, the server sends the processing results to the client.

The above-noted conventional approach has some problems. For example, there is a long delay between two data packets transmitted by the client. After a received data packet is processed using the voice resources, the server has to wait for a long time before processing a next data packet from the client. During the delay, the voice resources are not used, hence reducing the utilization ratio of voice resources and the concurrent processing capacity of voice data.

Hence it is highly desirable to in the techniques for voice data processing.

BRIEF SUMMARY OF THE INVENTION

According to one embodiment, a method is provided for voice data processing. For example, a first data packet included in voice data transmitted by a client is received; the first data packet is stored in a storage area; whether to process one or more second data packets stored in the storage area is determined based on at least information associated with a type of the first data packet and a current storage state of the storage area; in response to a determination to process the second data packets, voice resources are applied for; and the second data packets stored in the storage area are processed using the voice resources.

According to another embodiment, a device for voice data processing includes: a buffer module, a determination module, and a processing module. The buffer module is configured to receive a first data packet included in voice data transmitted by a client and store the first data packet in a storage area. The determination module is configured to determine whether to process one or more second data packets stored in the storage area based on at least information associated with a type of the first data packet and a current storage state of the storage area. The processing module is configured to, in response to a determination to process the second data packets, apply for voice resources and process the second data packets stored in the storage area using the voice resources.

According to yet another embodiment, a non-transitory computer readable storage medium comprises programming instructions for voice data processing. The programming instructions are configured to cause one or more data processors to execute certain operations. For example, a first data packet included in voice data transmitted by a client is received; the first data packet is stored in a storage area; whether to process one or more second data packets stored in the storage area is determined based on at least information associated with a type of the first data packet and a current storage state of the storage area; in response to a determination to process the second data packets, voice resources are applied for; and the second data packets stored in the storage area are processed using the voice resources.

For example, the systems and methods described herein are configured to improve a utilization ratio of voice resources and a concurrent processing capacity of voice data.

Depending upon embodiment, one or more benefits are achieved. These benefits and various additional objects, features and advantages of various embodiments of the present invention are fully appreciated with reference to the detailed description and accompanying drawings that follow.

DETAILED DESCRIPTION OF TILE INVENTION

Figure 1:
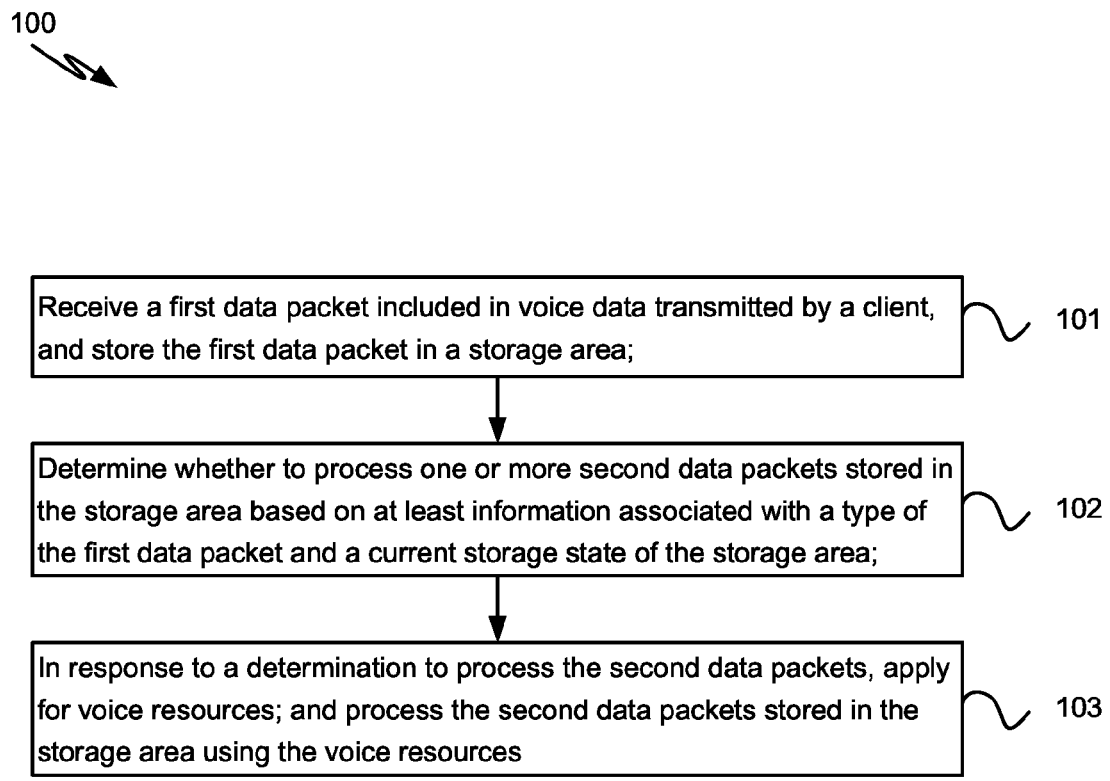
FIG. 1 is a simplified diagram showing a method for voice data processing according to one embodiment of the present invention.

FIG. 1 is a simplified diagram showing a method for fir voice data processing according to one embodiment of the present invention. This diagram is merely an example, which should not unduly limit the scope of the claims. One of ordinary skill in the art would recognize many variations, alternatives, and modifications. The method 100 includes at least the process 101 for receiving a first data packet included in voice data transmitted by a client and storing the first data packet in a storage area, the process 102 for determining whether to process one or more second data packets stored in the storage area based on at least information associated with a type of the first data packet and a current storage state of the storage area, and the process 103 for, in response to a determination to process the second data packets, applying for voice resources and processing the second data packets stored in the storage area using the voice resources.

According to one embodiment, during the process 101, a first data packet included in voice data transmitted by a client is received and stored in a storage area. For example, during the process 102, it is determined whether to process one or more second data packets stored in the storage area based on at least information associated with a type of the first data packet and a current storage state of the storage area. In another example, during the process 103, in response to a determination to process the second data packets, voice resources are applied for, and the second data packets stored in the storage area are processed using the voice resources.

According to another embodiment, before storing the first data packet in a storage area, the method 100 includes a process for determining whether to store the first data packet in the storage area based on at least information associated with a size of available resources of a server, and a process for, in response to a determination to store first the data packet in the storage area, storing the first data packet in a storage area. For example, the process for determining whether to store the first data packet in the storage area based on at least information associated with a size of available resources of a server includes: a process for determining to store the first data packet in the storage area in response to a size of available hardware resources of the server being smaller than a first predetermined threshold; or a process for determining to store the first data packet in the storage area in response to a size of available voice resources of the server being smaller than a second predetermined threshold.

According to yet another embodiment, the process for determining whether to process the second data packets stored in the storage area based on at least information associated with a type of the first data packet and a current storage state of the storage area includes: a process for determining to process the second data packets stored in the storage area in response to the first data packet being a final packet or the storage area being full, and a process for determining not to process the second data packets stored in the storage area in response to the first data packet being not the final packet or the storage area being not full. For example, before storing the first data packet in the storage area, the method 100 further includes a process for assigning the storage area for the first data packet in response to the first data packet being an initial packet.

Figure 2:
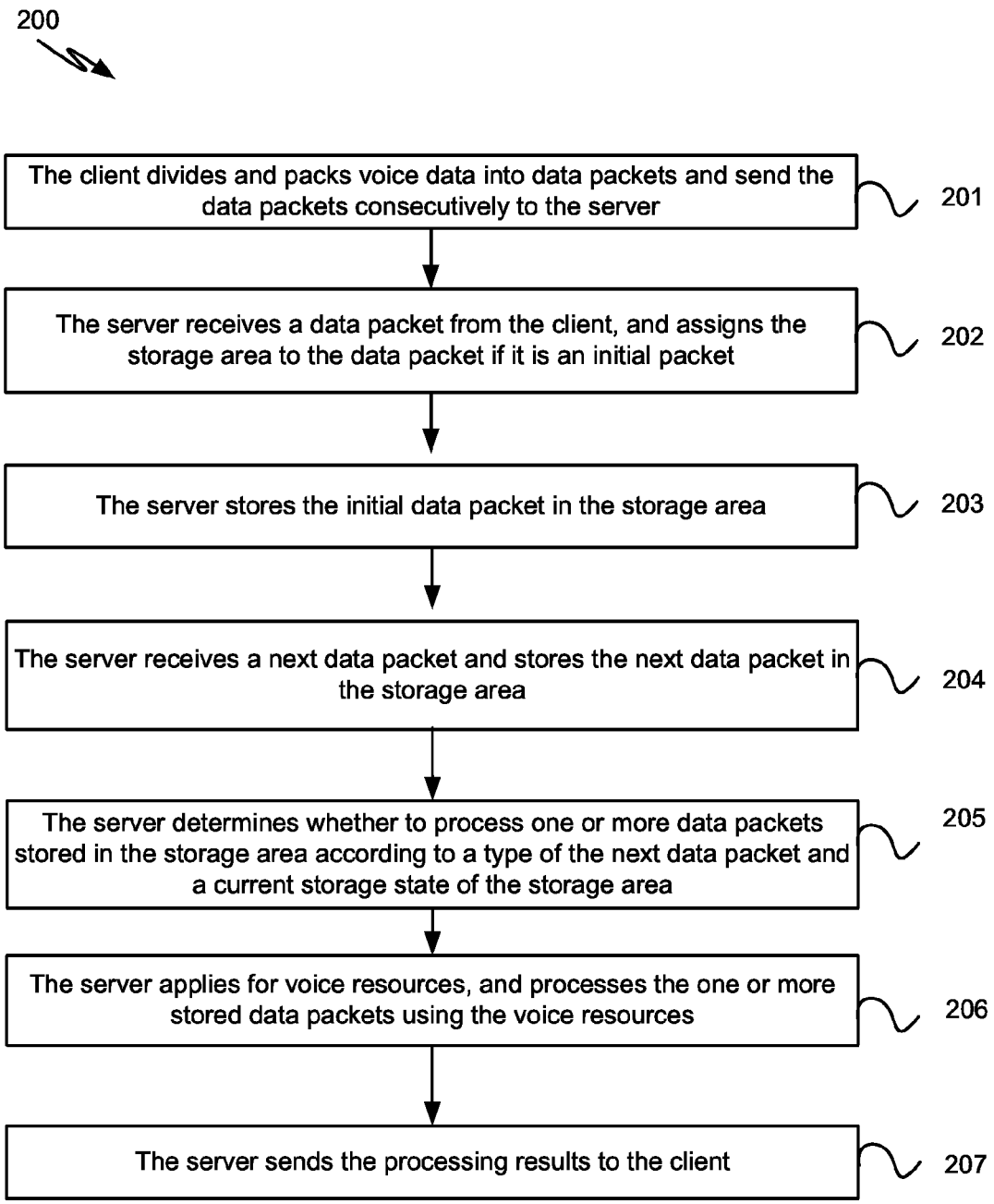
FIG. 2 is a simplified diagram showing a method for voice data processing according to another embodiment of the present invention.

FIG. 2 is a simplified diagram showing a method for voice data processing according to another embodiment of the present invention. This diagram is merely an example, which should not unduly limit the scope of the claims. One of ordinary skill in the art would recognize many variations, alternatives, and modifications. The method 200 includes at least the processes 201-207.

According to one embodiment, during the process 201, a client divides and packs voice data into data packets and transmits the data packets to a server consecutively. For example, the client converts user voice into the voice data and sends the voice data to the server. In another example, the client receives voice inputs by a user, converts the received voices into the voice data and divides the voice data into data pieces according to a size of voice data. As an example, the client packs the data pieces into the data packets and transmits the data packets to the server consecutively according to a sequence in the voice data. The data packets include an initial packet, one or more middle packets and a final packet, in some embodiments. A first data packet transmitted by the client is the initial packet; the data packets transmitted after the initial packet are the middle packets; and a last packet transmitted after the middle packets is the final packet.

In one embodiment, the client receives an audio clip input by the user, converts the received audio clip into a first voice data, and cuts the first voice data into four data pieces. The client packs the four data pieces into four data packets and transmits the data packets to the server consecutively according to a sequence in the voice data. As an example, the data packets include an initial packet, middle packets and a final packet. The first data packet transmitted by the client is the initial packet; the second and the third data packets are the middle packets and the fourth packet is the final packet.

According to another embodiment, during the process 202, the server receives a data packet from the client and assigns the storage area for the data packet if the data packet is an initial packet. For example, a type of a data packet includes an initial packet, a middle packet and a final packet. Upon receipt of a data packet from the client, the server reads the type of the data packet from a type-carrying field included in the header of the data packet and assigns the storage area for the data packet when the type of the data packet corresponds to the initial packet.

In one embodiment, when receiving data packets from the client, the server reads a type of a data packet from a type-carrying field included in the header of the data packet. For example, if a particular data packet corresponds to the initial packet, the server assigns storage area 1 for the initial data packet. As an example, as the voice data include a plurality of data packets, the assigned storage area is larger in size than the initial packet.

In another embodiment, during the process 203, the server stores the received data packet in the storage area. For example, upon receipt of the initial packet of the voice data, the server assigns the storage area for the received initial packet instead of immediately applying for voice resources to process the data packet. Voice resources refer to the resources for voice data processing. The server has a certain quantity of voice resources, and a particular voice resource can be used to process a particular piece of voice data at a time. In the four-data-packet example, the server stores the first data packet in storage area 1, waits for the second data packet, the third data packet and the fourth data packet from the client, and stores the first data packet in storage area 1. In another example, the size of the storage area is bigger than that of the initial packet. After the initial packet is stored in the storage area, the storage area is not full, in some embodiments.

In yet another embodiment, the client sends a next data packet after sending the initial packet of the voice data. The server receives the next data packet transmitted by the client during the process 204 after storing the received initial packet in the storage area. For example, during the process 204, the server receives the next data packet from the client and stores the next data packet in the storage area. The server captures the type of the next data packet and the storage state of the storage area after receiving the next data packet from the client. For example, upon receipt of a data packet from the client, the server reads the type of the next data packet from the type-carrying field included in the header of the next data packet and captures the storage state of the storage area.

According to one embodiment, during the process 205, the server determines whether to process one or more data packets stored in the storage area according to the type of the next data packet and the current storage state of the storage area. For example, the storage state of the storage area includes a full state or a not-full state. As an example, the process for determining whether to process the one or more data packets stored in the storage area according to the type of the next data packet and the current storage state of the storage area includes: if the next data packet is the final packet or the current storage area is full, the server determines to process the one or more data packets stored in the storage area; if the next data packet is not the final packet or the current storage area is not full, the server determines not to process the one or more data packets stored in the storage area. In some embodiments, if the size of the storage area is smaller than that of the voice data, the storage area may be fully occupied by the previously received data packets and the state of the storage area changes from not full to full before the final packet of the voice data is received by the server. If the size of the storage area is bigger than or equal to that of the voice data, the storage area can accommodate all data packets of the voice data and the server can receive all data packets of the voice data, including the final packet.

According to another embodiment, if it is determined not to process the one or more data packets stored in the storage area, that is, the client still has data packets of the voice data to be transmitted, the server returns and executes the process 204 to receive more data packets from the client until the final packet of the voice data is received or the storage area is full. Then the server executes the process 206, in some embodiments. For example, if a current storage area is full, it is determined to process the one or more data packets stored in the storage area. As an example, when the data packets stored in the storage area are being processed, the data packets stored in the storage area is to be cleared. If the client still has data packets of the voice data to be transmitted, the server continues to receive the data packets of the voice data transmitted by the client and continues to store the received data packets in the cleared storage area or directly process the received data packets, according to certain embodiments.

According to yet another embodiment, if the size of storage area 1 is bigger than or equal to that of voice data 1, upon receipt of a data packet from the client, the server reads the type of the data packet from the type-carrying field included in the header of the data packet. In the four-data-packet example, if the server receives the first data packet from the client, it determines that the first data packet is the initial packet; the server assigns storage area 1 to the first data packet and stores the received first data packet in storage area 1. The client still has data packets of voice data 1 to be transmitted, and the server continues to receive the data packets of the voice data transmitted by the client. In yet another example, when the server receives the second data packet and the third data packet from the client and determines that the second and third data packets are the middle packets, the server stores the second and the third data packets in storage area 1. The client still has one data packet of voice data 1 to be transmitted, so the server continues to wait for the fourth data packet of the voice data from the client. For example, if the server receives the fourth data packet and determines that the fourth data packet is the final packet, it stores the received fourth data packet in storage area 1. Then the server processes the four received data packets stored in storage area 1, in some embodiments.

In one embodiment, if the size of storage area 1 is smaller than that of voice data 1 and it is assumed that storage area 1 can only accommodate the first and second data packets, it is determined that storage area 1 is already full when the second data packet is stored in storage area 1. At that point the server processes the first and the second data packets stored in storage area 1. In certain embodiments, when the server is processing the first and the second data packets stored in storage area 1, the first and the second data packets stored in the storage area are cleared. At this time, the client still has the third and fourth data packets of voice data 1 to be transmitted. As an example, the server waits to receive the third and fourth data packets and can continue to store the received data packets in the cleared storage area 1 or directly process the received third and fourth data packets.

In another embodiment, during the process 206, the server applies for voice resources and processes the one or more data packets stored in the storage area using the voice resources. For example, when it is determined to process the data packets stored in the storage area, the server applies for voice resources and processes the data packets stored in the storage area using the voice resources. As an example, existing algorithms can be used to process data packets using the voice resources.

In yet another embodiment, processing voice data consumes a considerable amount of the server memory. Upon initialization, the server needs to load a voice model, an acoustic model and other model files into the internal memory. For example, the model files are normally very large (e.g., about 30 G), which occupy a considerable amount of the server memory. Moreover, processing voice data needs to intensively use a central processing unit (CPU). As an example, processing voice data may fully occupy one of the cores of the CPU, and the speed for processing voice data may be slow. In some embodiments, the server stores the received data packets in the storage area. Only when a received data packet corresponds to the final packet or the storage area is full, the server applies for voice resources and processes the stored data packets using the voice resources, so as to improve a concurrent processing capacity of voice data, in certain embodiments.

According to one embodiment, during the process 207, the server sends processing results to the client. For example, the sever processes the data packets stored in the storage area using the voice resources and sends the processing results to the client upon completion. The processing results include a success or a failure of voice data processing. As an example, the processing results are indicated by 0 or −1, where 0 represents a success of voice data processing and −1 represents a failure of voice data processing.

Figure 3:
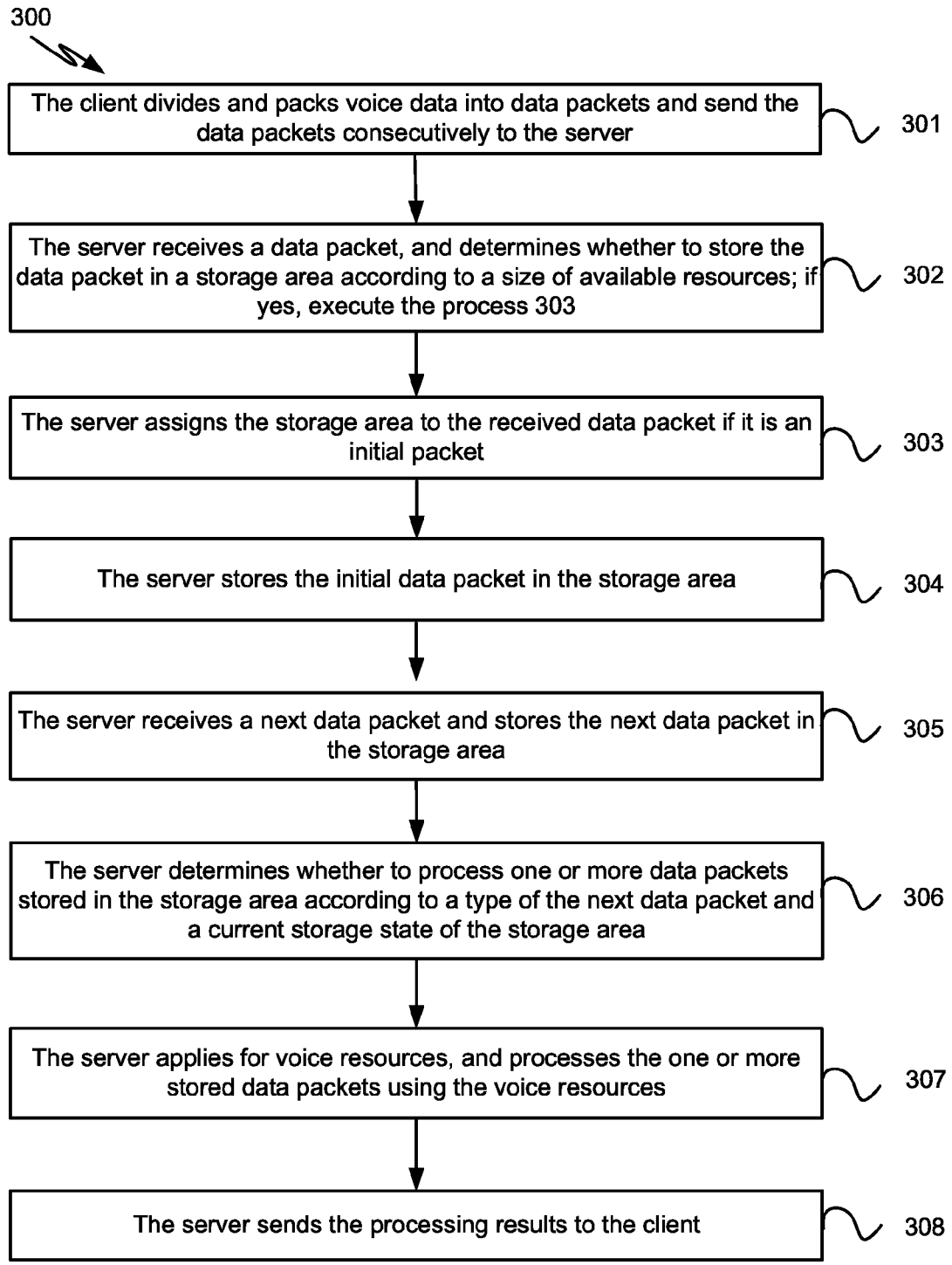
FIG. 3 is a simplified diagram showing a method for voice data processing according to yet another embodiment of the present invention.

FIG. 3 is a simplified diagram showing a method for voice data processing according to yet another embodiment of the present invention. This diagram is merely an example, which should not unduly limit the scope of the claims. One of ordinary skill in the art would recognize many variations, alternatives, and modifications. The method 300 includes at least the processes 301-308.

According to one embodiment, during the process 301, a client divides voice data, packs them into data packets and transmits the data packets to a server consecutively. For example, the client converts user voice into the voice data and sends the voice data to the server. In another example, the client receives voice inputs by a user, converts the received voices into the voice data and divides the voice data into data pieces according to a size of voice data. As an example, the client packs the data pieces into the data packets and transmits the data packets to the server consecutively according to a sequence in the voice data. The data packets include an initial packet, one or more middle packets and a final packet, in some embodiments. A first data packet transmitted by the client is the initial packet; the data packets transmitted after the initial packet are the middle packets; and a last packet transmitted after the middle packets is the final packet.

In one embodiment, the client receives an audio clip input by the user, converts the received audio clip into a first voice data, and cuts the first voice data into four data pieces. The client packs the four data pieces into four data packets and transmits the data packets to the server consecutively according to a sequence in the voice data. As an example, the data packets include an initial packet, middle packets and a final packet. The first data packet transmitted by the client is the initial packet; the second and the third data packets are the middle packets; and the fourth packet is the final packet.

According to another embodiment, during the process 302, the server receives a data packet from the client and determines whether to store the received data packet in the storage area according to a size of the available resources of the server. If the received data packet is determined to be stored, the process 303 is executed. For example, the available resources include available hardware resources and/or available voice resources. The hardware resources include a number of CPU cores, and the voice resources refer to the resources for voice data processing. The server has a certain quantity of voice resources and a particular voice resource can process a piece of voice data at a time.

According to yet another embodiment, the process for determining whether to store the received data packet in the storage area according to the size of the available resources of the server includes: a process for determining whether to store the received data packet in the storage area according to the available hardware resources and the available voice resources of the server. For example, it is determined to store the received data packet in the storage area if the size of the available hardware resources of the server is smaller than a first predetermined threshold. In another example, it is determined to store the received data packet in the storage area if the size of the available voice resources of the server is smaller than a second predetermined threshold. As an example, the first predetermined threshold and the second predetermined threshold can be set and modified according to system needs.

In one embodiment, the hardware resources of the server the number of CPU cores. The first predetermined threshold is 4. If the number of currently available CPU cores is 2 which is smaller than the first predetermined threshold 4, the available hardware resources of the server is insufficient and therefore it is determined to store the received data packet in the storage area. On the other hand, if the number of available CPU cores is 5 which is larger than the first predetermined threshold 4, the available hardware resources of the server is sufficient and therefore it is determined to directly apply for voice resources and process the received data packet using the voice resources instead of storing the received data packet in the storage area, according to certain embodiments.

In another embodiment, the second predetermined threshold is 6. If the number of available voice resources is 4 which is smaller than the second predetermined threshold 6, the available voice resources of the server are insufficient and therefore it is determined to store the first data packet in the storage area. On the other hand, if the number of available voice resources is 8 which is larger than the second predetermined threshold 6, the available voice resources of the server are sufficient and therefore it is determined to directly apply for voice resources and process the received data packet using the voice resources instead of storing the data packet in the storage area, according to some embodiments. For example, if it is determined to store the received data packet, the server assigns the storage area for the received data packet according to the type of the received data packet and executes the process 303. In another example, if it is determined not to store the received data packet, the server applies for voice resources and processes the received data packet using the voice resources. In some embodiments, existing algorithms can be used to process data packets using the voice resources.

According to one embodiment, during the process 303: if the received data packet is the initial packet, the server assigns the storage area for the received data packet. For example, a type of a data packet includes an initial packet, a middle packet and a final packet. Upon receipt of a data packet from the client, the server reads the type of the data packet from a type-carrying field included in the header of the data packet and assigns the storage area for the data packet when the type of the data packet corresponds to the initial packet.

In one embodiment, when receiving data packets from the client, the server reads a type of a data packet from a type-carrying field included in the header of the data packet. For example, if a particular data packet corresponds to the initial packet, the server assigns storage area 1 for the initial data packet. As an example, as the voice data include a plurality of data packets, the assigned storage area is larger in size than the initial packet.

According to another embodiment, during the process 304, the server stores the received data packet in the storage area. For example, upon receipt of the initial packet of the voice data, the server assigns the storage area for the received initial packet instead of immediately applying for voice resources to process the data packet.

In the four-data-packet example, the server stores the first data packet in storage area 1, waits for the second data packet, the third data packet and the fourth data packet from the client, and stores the first data packet in storage area 1. In another example, the size of the storage area is bigger than that of the initial packet. After the initial packet is stored in the storage area, the storage area is not full, in some embodiments.

In yet another embodiment, the client sends a next data packet after sending the initial packet of the voice data. The server receives the next data packet transmitted by the client during the process 305 after storing the received initial packet in the storage area. For example, during the process 305, the server receives the next data packet from the client and stores the next data packet in the storage area. The server captures the type of the next data packet and the storage state of the storage area after receiving the next data packet from the client. For example, upon receipt of a data packet from the client, the server reads the type of the next data packet from the type-carrying field included in the header of the next data packet and captures the storage state of the storage area.

In yet another embodiment, during the process 306, the server determines whether to process one or more data packets stored in the storage area according to the type of the next data packet and the current storage state of the storage area. For example, the storage state of the storage area includes a full state or a not-full state. As an example, the process for determining whether to process the one or more data packets stored in the storage area according to the type of the next data packet and the current storage state of the storage area includes: if the next data packet is the final packet or the current storage area is full, the server determines to process the one or more data packets stored in the storage area; if the next data packet is not the final packet or the current storage area is not full, the server determines not to process the one or more data packets stored in the storage area. In some embodiments, if the size of the storage area is smaller than that of the voice data, the storage area may be fully occupied by the previously received data packets and the state of the storage area changes from not full to full before the final packet of the voice data is received by the server. If the size of the storage area is bigger than or equal to that of the voice data, the storage area can accommodate all data packets of the voice data and the server can receive all data packets of the voice data, including the final packet.

According to another embodiment, if it is determined no to process the one or more data packets stored in the storage area, that is, the client still has data packets of the voice data to be transmitted, the server returns and executes the process 305 to receive more data packets from the client until the final packet of the voice data is received or the storage area is full. Then the server executes the process 307, in some embodiments.

For example, if a current storage area is full, it is determined to process the one or more data packets stored in the storage area. As an example, when the data packets stored in the storage area are being processed, the data packets stored in the storage area is to be cleared. If the client still has data packets of the voice data to be transmitted, the server continues to receive the data packets of the voice data transmitted by the client and continues to store the received data packets in the cleared storage area or directly process the received data packets, according to certain embodiments.

According to yet another embodiment, if the size of storage area 1 is bigger than or equal to that of voice data 1, upon receipt of a data packet from the client, the server reads the type of the data packet from the type-carrying field included in the header of the data packet. In the four-data-packet example, if the server receives the first data packet from the client, it determines that the first data packet is the initial packet; the server assigns storage area 1 to the first data packet and stores the received first data packet in storage area 1. The client still has data packets of voice data 1 to be transmitted, and the server continues to receive the data packets of the voice data transmitted by the client. In yet another example, when the server receives the second data packet and the third data packet from the client and determines that the second and third data packets are the middle packets, the server stores the second and the third data packets in storage area 1. The client still has one data packet of voice data 1 to be transmitted, so the server continues to wait for the fourth data packet of the voice data from the client. For example, if the server receives the fourth data packet and determines that the fourth data packet is the final packet, it stores the received fourth data packet in storage area 1. Then the server processes the four received data packets stored in storage area 1, in some embodiments.

In one embodiment, if the size of storage area 1 is smaller than that of voice data 1 and it is assumed that storage area 1 can only accommodate the first and second data packets, it is determined that storage area 1 is already full when the second data packet is stored in storage area 1. At that point the server processes the first and the second data packets stored in storage area 1. In certain embodiments, when the server is processing the first and the second data packets stored in storage area 1, the first and the second data packets stored in the storage area are cleared. At this time, the client still has the third and fourth data packets of voice data 1 to be transmitted. As an example, the server waits to receive the third and fourth data packets and can continue to store the received data packets in the cleared storage area 1 or directly process the received third and fourth data packets.

In another embodiment, during the process 307, the server applies for voice resources and processes the one or more data packets stored in the storage area using the voice resources. For example, when it is determined to process the data packets stored in the storage area, the server applies for voice resources and processes the data packets stored in the storage area using the voice resources. As an example, existing algorithms can be used to process data packets using the voice resources.

In yet another embodiment, during the process 308, the server sends processing results to the client. For example, the sever processes the data packets stored in the storage area using the voice resources and sends the processing results to the client upon completion. The processing results include a success or a failure of voice data processing. As an example, the processing results are indicated by 0 or −1, where 0 represents a success of voice data processing and −1 represents a failure of voice data processing.

Figure 4:
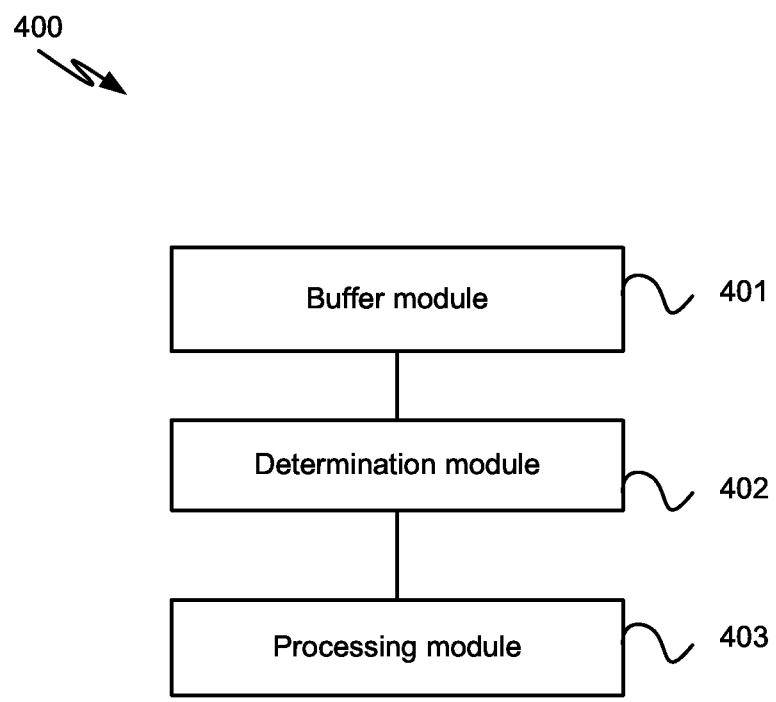
FIG. 4 is a simplified diagram showing a device for voice data processing according to one embodiment of the present invention.

FIG. 4 is a simplified diagram showing a device for voice data processing according to one embodiment of the present invention. This diagram is merely an example, which should not unduly limit the scope of the claims. One of ordinary skill in the art would recognize many variations, alternatives, and modifications. The device 400 includes a buffer module 401, a determination module 402, and a processing module 403.

According to one embodiment, the buffer module 401 is configured to receive a first data packet included in voice data transmitted by a client and store the first data packet in a storage area. For example, the determination module 402 is configured to determine whether to process one or more second data packets stored in the storage area based on at least information associated with a type of the first data packet and a current storage state of the storage area. In another example, the processing module 403 is configured to, in response to a determination to process the second data packets, apply for voice resources and process the second data packets stored in the storage area using the voice resources.

According another embodiment, the determination module 402 is further configured to determine whether to store the first data packet in the storage area based on at least information associated with a size of available resources of a server. For example, the buffer module is further configured to, in response to a determination to store first the data packet in the storage area, store the first data packet in a storage area.

Figure 5:
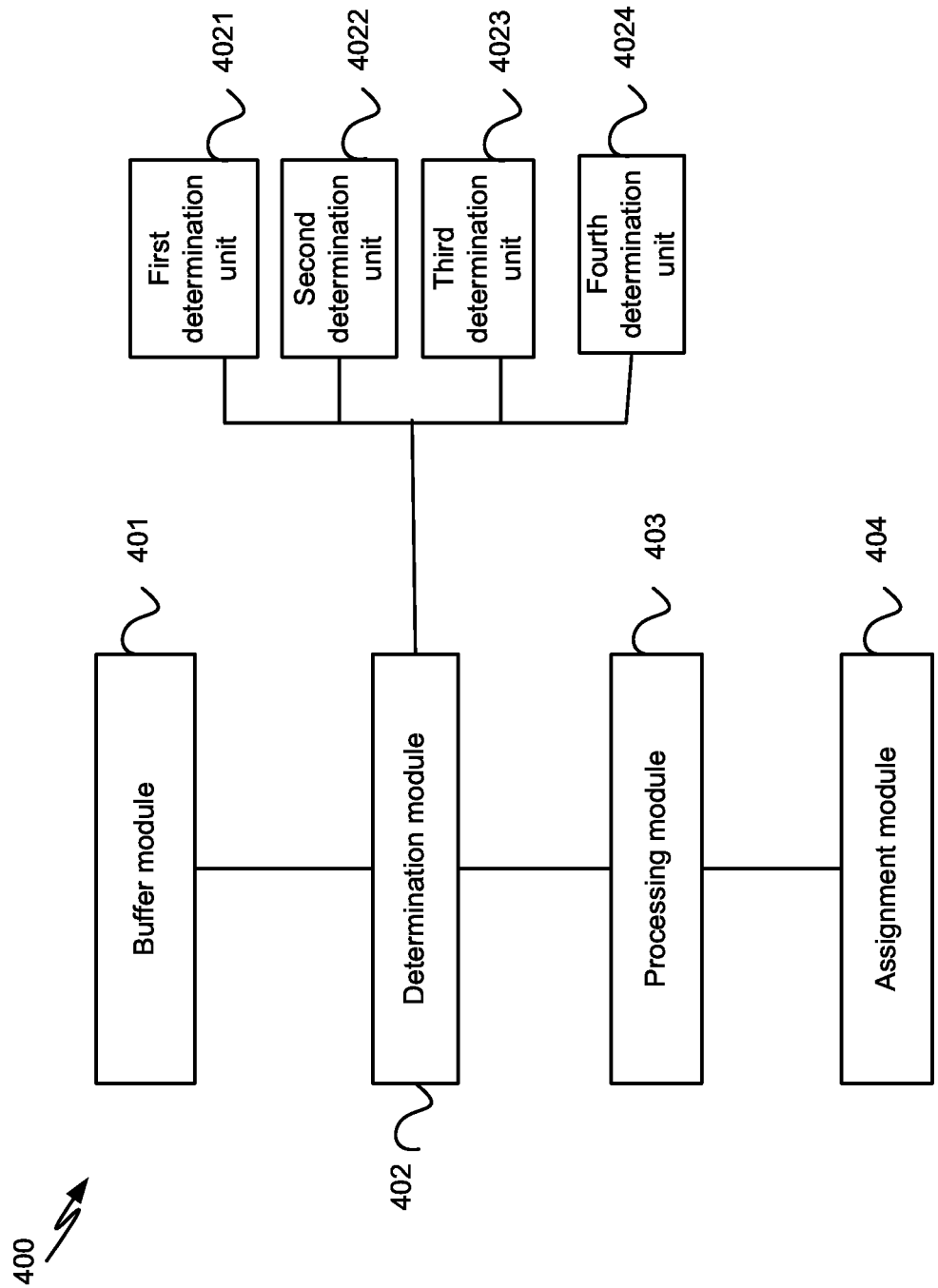
FIG. 5 is a simplified diagram showing a device for voice data processing according to another embodiment of the present invention.

FIG. 5 is a simplified diagram showing the device 400 for voice data processing according to another embodiment of the present invention. This diagram is merely an example, which should not unduly limit the scope of the claims. One of ordinary skill in the art would recognize many variations, alternatives, and modifications.

According to one embodiment, the determination module 402 includes: a first determination unit 4021, and a second determination unit 4022. For example, the first determination unit 4021 is configured to determine to store the first data packet in the storage area if a size of available hardware resources of the server is smaller than a first predetermined threshold. The second determination unit 4022 is configured to determine to store the first data packet in the storage area if a size of available voice resources of the server is smaller than a second predetermined threshold.

According to another embodiment, the determination module 402 includes a third determination unit 4023 and a fourth determination unit 4024. For example, the third determination 4023 is configured to determine to process the second data packets stored in the storage area in response to the first data packet being a final packet or the storage area being full. The fourth determination unit 4024 is configured to determine not to process the second data packets stored in the storage area in response to the first data packet being not the final packet or the storage area being not full. According to yet another embodiment, the device 400 further includes: an assignment module 404 configured to assign the storage area for the first data packet in response to the first data packet being an initial packet.

According to one embodiment, a method is provided for voice data processing. For example, a first data packet included in voice data transmitted by a client is received; the first data packet is stored in a storage area; whether to process one or more second data packets stored in the storage area is determined based on at least information associated with a type of the first data packet and a current storage state of the storage area; in response to a determination to process the second data packets, voice resources are applied for; and the second data packets stored in the storage area are processed using the voice resources. For example, the method is implemented according to at least FIG. 1, FIG. 2, and/or FIG. 3.

According to another embodiment, a device for voice data processing includes: a buffer module, a determination module, and a processing module. The buffer module is configured to receive a first data packet included in voice data transmitted by a client and store the first data packet in a storage area. The determination module is configured to determine whether to process one or more second data packets stored in the storage area based on at least information associated with a type of the first data packet and a current storage state of the storage area. The processing module is configured to, in response to a determination to process the second data packets, apply for voice resources and process the second data packets stored in the storage area using the voice resources. For example, the device is implemented according to at least FIG. 4, and/or FIG. 5.

According to yet another embodiment, a non-transitory computer readable storage medium comprises programming instructions for voice data processing. The programming instructions are configured to cause one or more data processors to execute certain operations. For example, a first data packet included in voice data transmitted by a client is received; the first data packet is stored in a storage area; whether to process one or more second data packets stored in the storage area is determined based on at least information associated with a type of the first data packet and a current storage state of the storage area; in response to a determination to process the second data packets, voice resources are applied for and the second data packets stored in the storage area are processed using the voice resources. For example, the storage medium is implemented according to at least FIG. 1, FIG. 2, and/or FIG. 3.

The above only describes several scenarios presented by the present disclosure, and the description is relatively specific and detailed, yet it cannot therefore be understood as limiting the scope of this invention's patent. It should be noted that ordinary technicians in the field may also, without deviating from the invention's conceptual premises, make a number of variations and modifications, which are all within the scope of this invention. As a result, in terms of protection, the patent claims shall prevail.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention is combined.

Additionally, the methods and systems described herein is implemented on many different types of processing devices by program code comprising program instructions that are executable by the device processing subsystem. The software program instructions includes source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) is stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods is provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein is connected directly or indirectly to each other in order to allow the flow of data needed for their operations. It is also noted that a module or processor includes but is not limited to a unit of code that performs a software operation, and is implemented for example as a subroutine unit of code, or as a software function unit of code, or as an object (as in an object-oriented paradigm), or as an applet, or in a computer script language, or as another type of computer code. The software components and/or functionality is located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what is claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features is described above as acting in certain combinations and even initially claimed as such, one or more features from a claimed combination can in some cases be excised from the combination, and the claimed combination is directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing is advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for voice data processing, the method comprising:
    receiving first and second voice data packets included in voice data transmitted by a client;
    storing the received first and second voice data packets in a storage area;
    determining whether the first voice data packet is an initial voice data packet, a middle voice data packet, or a final voice data packet;
    determining whether a current storage state of the storage area is full or not full;
    determining to process the second voice data packet based upon (i) the first voice data packet being determined to be a middle voice data packet and the current storage state of the storage area being determined to be full, or based upon (ii) the first voice data packet being determined to be a final voice packet and the current storage state of the storage area being determined to be full or not full; and
    in response to the determination to process the second voice data packet:
        applying for voice resources; and
        processing the second voice data packet stored in the storage area using the applied-for voice resources.

2. The method of claim 1, wherein the first data packet is stored in the storage area based on at least information associated with a size of available resources of a server.

3. The method of claim 2, wherein the first voice data packet is stored in the storage area based on:
    a size of available hardware resources of the server being smaller than a first predetermined threshold; or
    a size of available voice resources of the server being smaller than a second predetermined threshold.

4. The method of claim 1, further comprising:
    assigning the storage area for the first voice data packet in response to the first voice data packet being an initial voice data packet.

5. A device for voice data processing comprising:
    one or more data processors; and
    a computer-readable storage medium storing a buffer module, a determination module, and a processing module;
    the buffer module configured to be executed by the one or more data processors so as to cause the one or more data processors to receive first and second voice data packets included in voice data transmitted by a client and to store the received first and second voice data packets in a storage area;
    the determination module configured to be executed by the one or more data processors so as to cause the one or more data processors to determine whether the first voice data packet is an initial voice data packet, a middle voice data packet, or a final voice data packet;
    the determination module further configured to be executed by the one or more data processors so as to cause the one or more data processors to determine a current storage state of the storage area;
    the determination module further configured to be executed by the one or more data processors so as to cause the one or more data processors to determine to process the second voice data packet based upon (i) the first voice data packet being determined to be a middle voice data packet and the current storage state of the storage area being determined to be full, or based upon (ii) the first voice data packet being determined to be a final voice data packet and the current storage state of the storage area being determined to be full or not full;
    the processing module configured to be executed by the one or more data processors so as to cause the one or more data processors to, in response to determination to process the second voice data packet, apply for voice resources and process the second voice data packet stored in the storage area using the applied-for voice resources.

6. The device of claim 5, wherein:
    the determination module is further configured to be executed by the one or more data processors so as to cause the one or more data processors to determine to store the first voice data packet in the storage area based on at least information associated with a size of available resources of a server.

7. The device of claim 6, wherein the determination module comprises:
    a first determination unit configured to be executed by the one or more data processors so as to cause the one or more data processors to determine to store the first voice data packet in the storage area based on a size of available hardware resources of the server being smaller than a first predetermined threshold; and a second determination unit configured to be executed by the one or more data processors so as to cause the one or more data processors to determine to store the first voice data packet in the storage area based on a size of available voice resources of the server being smaller than a second predetermined threshold.

8. The device of claim 5, further comprising:
an assignment module configured to be executed by the one or more data processors so as to cause the one or more data processors to assign the storage area for the first voice data packet in response to the first voice data packet being an initial voice data packet.

9. A non-transitory computer readable storage medium comprising programming instructions for voice data processing, the programming instructions configured to cause one or more data processors to execute operations comprising:

receiving first and second voice data packets included in voice data transmitted by a client;

storing the received first and second voice data packets in a storage area;

determining whether the first voice data packet is an initial voice data packet, a middle voice data packet, or a final voice data packet;

determining whether a current storage state of the storage area is full or not full;

determining to process the second voice data packet based upon (i) the first voice data packet being determined to be a middle voice data packet and the current storage state of the storage area being determined to be full, or based upon (ii) the first voice data packet being determined to be a final voice packet and the current storage state of the storage area being determined to be full or not full; and in response to the determination to process the second voice data packet:

applying for voice resources; and processing the second voice data packet stored in the storage area using the applied-for voice resources.

* * * * *